United States Patent
Tashima et al.

(10) Patent No.: US 10,090,407 B2
(45) Date of Patent: Oct. 2, 2018

(54) SEMICONDUCTOR DEVICE AND MANUFACTURING METHOD

(71) Applicant: FUJI ELECTRIC CO., LTD., Kanagawa (JP)

(72) Inventors: Tsukasa Tashima, Matsumoto (JP); Kazuhiro Kitahara, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/421,366

(22) Filed: Jan. 31, 2017

(65) Prior Publication Data

US 2017/0263746 A1    Sep. 14, 2017

(30) Foreign Application Priority Data

Mar. 14, 2016   (JP) ................. 2016-049900

(51) Int. Cl.
| | | |
|---|---|---|
| *H01L 29/76* | (2006.01) | |
| *H01L 29/78* | (2006.01) | |
| *H01L 21/02* | (2006.01) | |
| *H01L 29/10* | (2006.01) | |
| *H01L 29/16* | (2006.01) | |
| *H01L 29/40* | (2006.01) | |
| *H01L 29/423* | (2006.01) | |

(Continued)

(52) U.S. Cl.
CPC .... *H01L 29/7802* (2013.01); *H01L 21/02529* (2013.01); *H01L 21/02532* (2013.01); *H01L 29/1095* (2013.01); *H01L 29/1608* (2013.01); *H01L 29/401* (2013.01); *H01L 29/42376* (2013.01); *H01L 29/4958* (2013.01); *H01L 29/66712* (2013.01)

(58) Field of Classification Search
CPC ............ H01L 29/1608; H01L 29/1095; H01L 21/02532; H01L 29/0847; H01L 29/401
USPC ........................................................ 257/329
See application file for complete search history.

(56) References Cited

U.S. PATENT DOCUMENTS

| | | | | |
|---|---|---|---|---|
| 6,046,490 A | * | 4/2000 | Arita ................. | H01L 21/76895 257/310 |
| 9,041,007 B2 | * | 5/2015 | Suekawa ................. | H01L 29/45 257/288 |

(Continued)

FOREIGN PATENT DOCUMENTS

| | | |
|---|---|---|
| JP | 2015-109474 A | 6/2015 |
| JP | 2015-162620 A | 9/2015 |
| WO | 2009128382 A1 | 10/2009 |

*Primary Examiner* — Andy Huynh (57) ABSTRACT

To restrict alloy formation between a hydrogen-absorbing layer of titanium or the like and an electrode of aluminum or the like, provided is a semiconductor device. The semiconductor device may include a semiconductor substrate. The semiconductor device may include a first layer that is formed above the semiconductor substrate. The first layer may contain a hydrogen-absorbing first metal. The semiconductor device may include a second layer that is formed above the first layer. The second layer may contain a second metal differing from the first metal. The semiconductor device may include an Si-containing layer that is formed between the first layer and the second layer and contains silicon. The second layer may further include silicon. The Si-containing layer may have a higher silicon concentration than the second layer. The second metal may be aluminum. The first metal may be titanium.

12 Claims, 6 Drawing Sheets

(51) Int. Cl.
*H01L 29/49* (2006.01)
*H01L 29/66* (2006.01)

(56) References Cited

U.S. PATENT DOCUMENTS

2011/0031506 A1    2/2011   Tamaso
2015/0295059 A1*  10/2015   Wada .................. H01L 29/4925
                                                    257/77

* cited by examiner

SEMICONDUCTOR DEVICE AND MANUFACTURING METHOD

The contents of the following Japanese patent application are incorporated herein by reference:
NO. 2016-049900 filed in JP on Mar. 14, 2016.

BACKGROUND

1. Technical Field

The present invention relates to a semiconductor device and a manufacturing method.

2. Related Art

Conventionally, in a semiconductor element formed on a semiconductor substrate such as SiC, a structure is known in which a barrier film made of titanium or the like is formed below an electrode made of aluminum or the like, as shown in Patent Document 1, for example. By absorbing hydrogen atoms or hydrogen ions with the barrier film, it is possible to protect the gate insulating film and restrict fluctuation in the threshold value of the semiconductor element.
Patent Document 1: Japanese Patent Application Publication No. 2015-109474

There are cases where, as a result of thermal processing performed when forming the electrode or after formation of the electrode, the barrier film forms an alloy with the electrode and part of the barrier film is lost.

SUMMARY

According to a first aspect of the present invention, provided is a semiconductor device. The semiconductor device may include a semiconductor substrate. The semiconductor device may include a first layer that is formed above the semiconductor substrate. The first layer may contain a hydrogen-absorbing first metal. The semiconductor device may include a second layer that is formed above the first layer. The second layer may contain a second metal differing from the first metal. The semiconductor device may include an Si-containing layer that is formed between the first layer and the second layer and contains silicon.

The second layer may further include silicon. The Si-containing layer may have a higher silicon concentration than the second layer. The second metal may be aluminum. The first metal may be titanium.

The semiconductor device may further include an alloy layer that is formed between the first layer and the second layer and includes the first metal and the second metal. The Si-containing layer may be arranged between the first layer and the alloy layer.

A silicon concentration distribution of the semiconductor device may include a peak in a depth direction of the Si-containing layer. The silicon concentration on the second layer side of the peak may decrease more gradually than on the first layer side of the peak.

A mass ratio of the silicon at a position of the peak may be greater than or equal to 10%. The Si-containing layer may have a thickness that is greater than or equal to 10 nm. The Si-containing layer may have a thickness that is less than or equal to 150 nm. The first layer may a thickness that is greater than or equal to 10 nm. The first layer may a thickness that is less than or equal to 1.0 µm.

According to a second aspect of the present invention, provided is a manufacturing method of a semiconductor device. The manufacturing method may include first layer formation of forming a first layer above the semiconductor substrate. The first layer may contain a hydrogen-absorbing first metal. The manufacturing method may include second layer formation of forming a second layer above the first layer. The second layer may contain a second metal differing from the first metal. The manufacturing method may include Si-containing layer formation of forming an Si-containing layer that contains silicon between the first layer and the second layer.

In the second layer formation, there may be an argon atmosphere inside a deposition chamber. Pressure within the chamber may be greater than or equal to 0.1 Pa. The pressure in the chamber may be less than or equal to 0.5 Pa. Temperature of a semiconductor substrate may be greater than or equal to 190° C. The temperature of the semiconductor substrate may be less than or equal to 400° C. In the second layer formation, silicon may be segregated between the first layer and the second layer by forming the second layer, to form the Si-containing layer.

In the second layer formation, the temperature of the semiconductor substrate may be greater than or equal to 250° C. The temperature of the semiconductor substrate may be less than or equal to 270° C.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
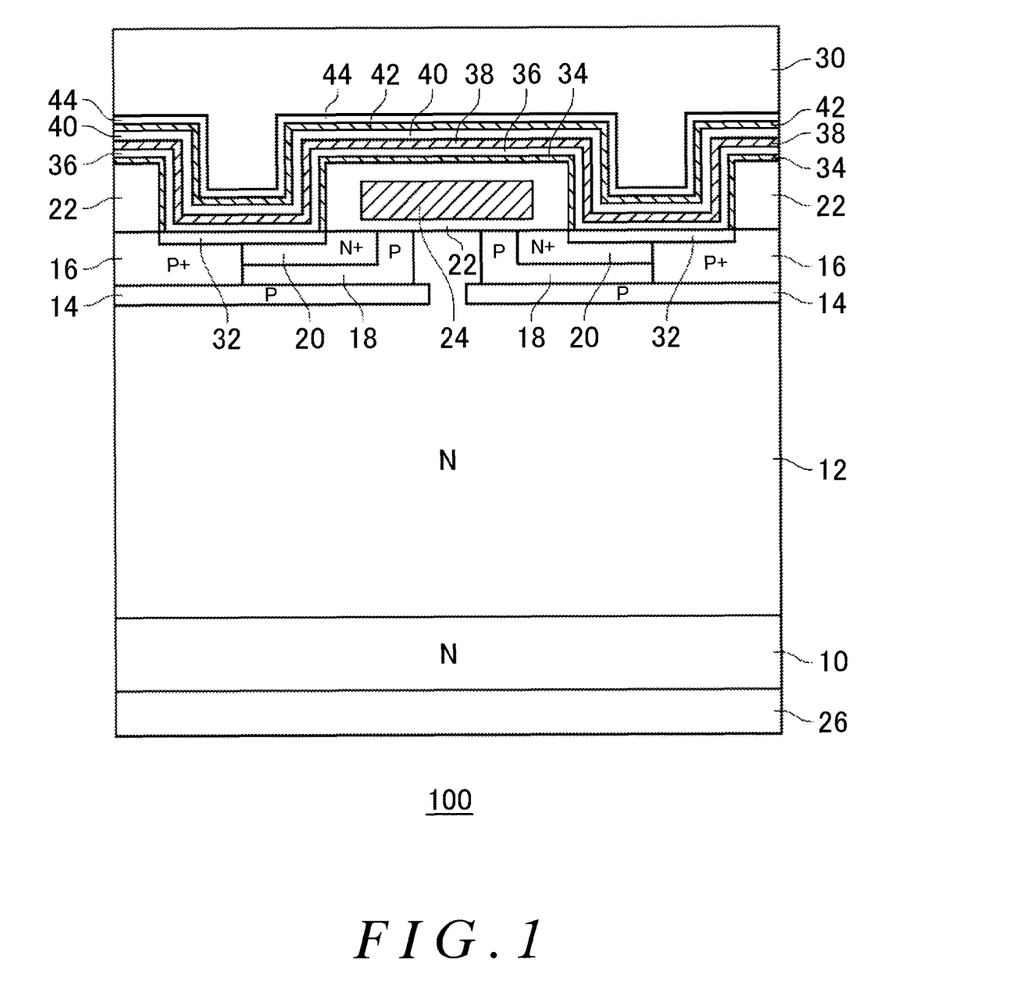
FIG. 1 is a cross-sectional view of a semiconductor substrate 100 according to one embodiment of the present invention.

FIG. 1 is a cross-sectional view of a semiconductor substrate 100 according to one embodiment of the present invention. The semiconductor substrate 100 includes a semiconductor substrate 10. A semiconductor element such as a power MOSFET is formed on the semiconductor substrate 10. The semiconductor substrate 10 is formed of a semiconductor such as SiC, for example. The semiconductor substrate 10 in the present example is N-type.

An N-type drift layer 12 is formed on the top surface of the semiconductor substrate 10 in the present example. The drift layer 12 is formed by epitaxially growing a semiconductor such as SiC, for example, on the semiconductor substrate 10. A drain electrode 26 is formed on the bottom surface of the semiconductor substrate 10.

A P-type base region 14 is formed in a partial region of the top surface of the drift layer 12. The base region 14 is formed by injecting P-type impurities such as aluminum into a partial region of the top surface of the drift layer 12, for example.

A P-type top surface region 18 is formed on a top surface of the base region 14. The top surface region 18 is formed by epitaxially growing a semiconductor such as SiC, for example, on the base region 14. A (P+)-type contact region 16 is formed in a partial region of the top surface region 18, and reaches from the top surface to the bottom surface of the top surface region 18. The contact region 16 is formed by ion-injecting P-type impurities such as aluminum into the partial region of the top surface region 18, for example.

An (N+)-type source region 20 is formed in a partial region of the top surface region 18. The source region 20 is formed by injecting N-type impurities such as phosphorous into a partial region of the top surface region 18, for example. An N-type region is formed between divided portions of the top surface region 18 and between divided portions of the base region 14, and this N-type region is connected to the drift layer 12. In this Specification, this N-type region is also referred to as the drift layer 12. After the impurities have been injected into the source region 20 and the contact region 16, the impurities may be activated by annealing the semiconductor layers in an atmosphere of inert gas, such as argon.

On the top surface of the semiconductor layer, the top surface region 18 is formed in a manner to be sandwiched by the source region 20 and the drift layer 12. A gate electrode 24 is formed above the top surface region 18 that is between the source region 20 and the drift layer 12. The gate electrode 24 is formed of polysilicon into which impurities have been injected, for example. The gate electrode 24 may also be formed above the source region 20 and the drift layer 12.

The gate insulating film 22 insulates the gate electrode 24 from the semiconductor layers such as the drift layer 12. An insulating material such as $SiO_2$, for example, is formed as the gate insulating film 22 using a method such as CVD. The gate insulating film 22 leaves portions of the source region 20 and the contact region 16 exposed.

A barrier layer 34 is formed on the gate insulating film 22. The barrier layer 34 is formed to cover the gate insulating film 22. The barrier layer 34 is formed of titanium nitride, for example. A silicide layer 32 is formed on the top surfaces of the source region 20 and the contact region 16 that are not covered by the gate insulating film 22. The silicide layer 32 is a nickel silicide layer, for example.

A lower hydrogen-absorbing layer 36 is formed on the barrier layer 34 and the silicide layer 32. The lower hydrogen-absorbing layer 36 is formed of a hydrogen-absorbing metal such as titanium. A nitride layer 38 is formed on the lower hydrogen-absorbing layer 36. The nitride layer 38 is formed of titanium nitride, for example.

An upper hydrogen-absorbing layer 40, which is an example of a first layer, is formed on the nitride layer 38. The upper hydrogen-absorbing layer 40 contains a first metal that absorbs hydrogen. The first metal is titanium, for example. The upper hydrogen-absorbing layer 40 may be formed of the same material as the lower hydrogen-absorbing layer 36.

A source electrode 30 containing a second metal that is different from the first metal is formed above the upper hydrogen-absorbing layer 40. The second metal is aluminum, for example. The source electrode 30 may include a substance other than the second metal. For example, the source electrode 30 is an AlSi alloy containing silicon.

An Si-containing layer 42 containing silicon is formed between the upper hydrogen-absorbing layer 40 and the source electrode 30. The Si-containing layer 42 refers to a region with a higher silicon concentration than the source electrode 30. The silicon concentration of the source electrode 30 refers to the mass ratio of silicon relative to the entire source electrode 30. A substance other than silicon may be included in the Si-containing layer 42. For example, the first metal such as titanium is included in the Si-containing layer 42.

By providing the Si-containing layer 42 between the upper hydrogen-absorbing layer 40 and the source electrode 30, it is possible to restrict formation of an alloy between the source electrode 30 and the upper hydrogen-absorbing layer 40. Therefore, a prescribed thickness of the upper hydrogen-absorbing layer 40 remains, and it is possible to maintain the hydrogen absorbing function. Accordingly, hydrogen is restricted from reaching the gate insulating film 22, and it is possible to restrict the fluctuation of the threshold value of the semiconductor substrate 100.

An alloy layer 44 including the first metal and the second metal may be formed between the upper hydrogen-absorbing layer 40 and the source electrode 30. The alloy layer 44 in the present example is an alloy including aluminum and titanium. The Si-containing layer 42 may also include the second metal, but the mass ratio of the second metal in the Si-containing layer 42 is less than the mass ratio of the second metal in the source electrode 30. At least a partial region of the Si-containing layer 42 preferably does not include the second metal. At least the interface with the upper hydrogen-absorbing layer 40 preferably does not include the second metal. The upper hydrogen-absorbing layer 40 does not include the second metal.

The Si-containing layer 42 may be formed between the upper hydrogen-absorbing layer 40 and the alloy layer 44. In this way, it is possible to efficiently restrict the formation of an alloy between the second metal included in the alloy layer 44 and the first metal of the upper hydrogen-absorbing layer 40. Furthermore, a portion of the Si-containing layer 42 may be formed in a portion of the alloy layer 44. In other words, at least a partial region of the alloy layer 44 on the upper hydrogen-absorbing layer 40 side may include an alloy of the first metal, the second metal, and silicon.

The Si-containing layer 42 may be formed using sputtering or the like, after formation of the upper hydrogen-absorbing layer 40 and before formation of the source electrode 30. Furthermore, the Si-containing layer 42 may be formed by segregating silicon above the upper hydrogen-absorbing layer 40 by performing thermal processing during or after the step of forming the source electrode 30 containing silicon. The segregation of the silicon can be controlled according to the concentration of silicon included in the source electrode 30, the temperature and time used when forming the source electrode 30, the thermal processing temperature and time after formation of the source electrode 30, and the like.

Figure 2:
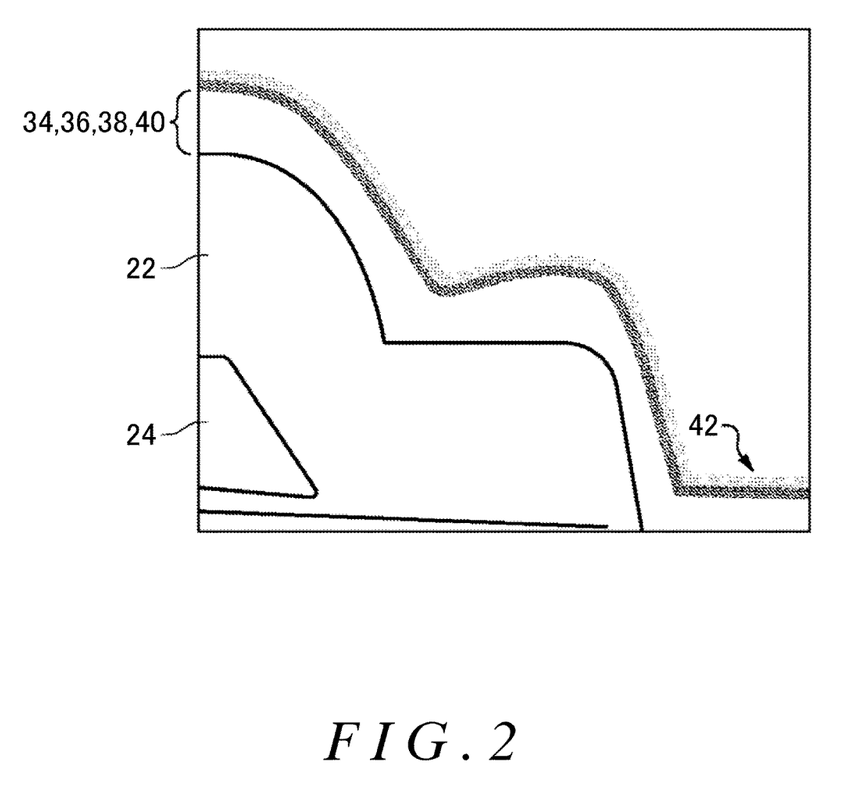
FIG. 2 is a schematic view of measurement results obtained by measuring the silicon concentration distribution in a cross section near the gate insulating film 22.

FIG. 2 is a schematic view of measurement results obtained by measuring the silicon concentration distribution in a cross section near the gate insulating film 22. The Si-containing layer 42 in this example was formed by segregating the silicon contained in the source electrode 30 above the upper hydrogen-absorbing layer 40 during the step of forming the source electrode 30 or the like. In FIG. 2, the silicon concentration is shown schematically using dot density.

As shown in FIG. 2, the Si-containing layer 42 in the present example is formed in a region contacting the top end of the upper hydrogen-absorbing layer 40. In this way, it is possible to restrict the formation of an alloy between the upper hydrogen-absorbing layer 40 provided under the Si-containing layer 42 and each of the metals that are farther upward than the Si-containing layer 42.

Figure 3:
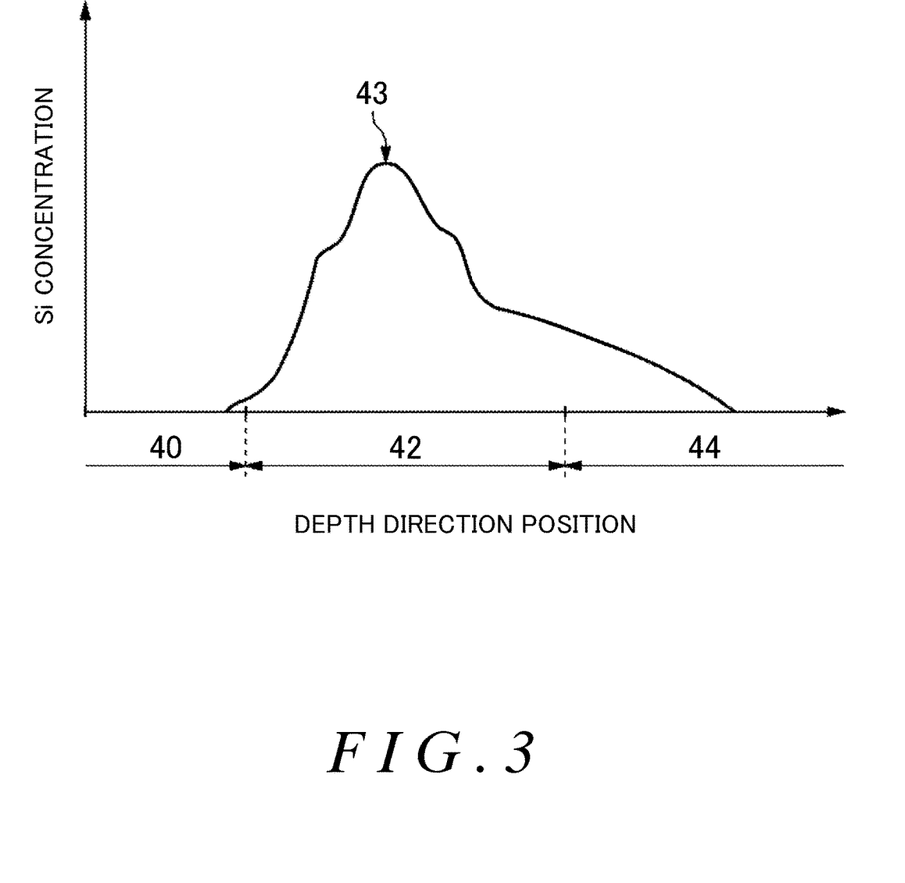
FIG. 3 shows an exemplary silicon concentration distribution in a depth direction of the Si-containing layer 42 shown in FIG. 2.

FIG. 3 shows an exemplary silicon concentration distribution in a depth direction of the Si-containing layer 42 shown in FIG. 2. The depth direction refers to the direction of a straight line connecting the upper hydrogen-absorbing layer 40 and the source electrode 30 across the shortest distance. In FIG. 3, the vertical axis indicates the silicon concentration, and the horizontal axis indicates the position in the depth direction. The vertical axis in FIG. 3 uses the silicon concertation of the source electrode 30 as the origin.

In the Si-containing layer 42 formed by segregating the silicon included in the source electrode 30, the silicon concentration is not uniform and there is a silicon concentration peak 43 at a prescribed depth position. Since the silicon concentration is high at the peak 43, it is possible to restrict the diffusion of the metal such as aluminum that is farther downward than the peak 43.

The silicon concentration on the source electrode 30 side of the peak 43 decreases more gradually than the silicon concentration on the upper hydrogen-absorbing layer 40 side of the peak 43. In other words, the silicon concentration on the upper hydrogen-absorbing layer 40 side of the peak 43 decreases sharply. Therefore, it is possible to form the upper hydrogen-absorbing layer 40 up to a region near the peak 43, and the film thickness of the upper hydrogen-absorbing layer 40 can be easily ensured.

For example, the silicon mass ratio at the peak 43 is greater than or equal to 10%. Therefore, it is possible to efficiently restrict the formation of an alloy between the first metal such as titanium and the second metal such as aluminum at positions farther downward than the peak 43. The silicon mass ratio at the peak 43 may be greater than or equal to 5 times the silicon mass ratio in the source electrode 30, or may be greater than or equal to 10 times the silicon mass ratio in the source electrode 30.

If the source electrode 30 is an AlSi alloy, the silicon mass ratio in the source electrode 30 may be approximately 1%, greater than or equal to 2%, or greater than or equal to 3%. There are cases where it is possible to increase the silicon concentration segregated in the Si-containing layer 42 by increasing the silicon concertation in the source electrode 30. Therefore, it is possible to effectively restrict the formation of an alloy between the first metal such as titanium and the second metal such as aluminum.

Figure 4:
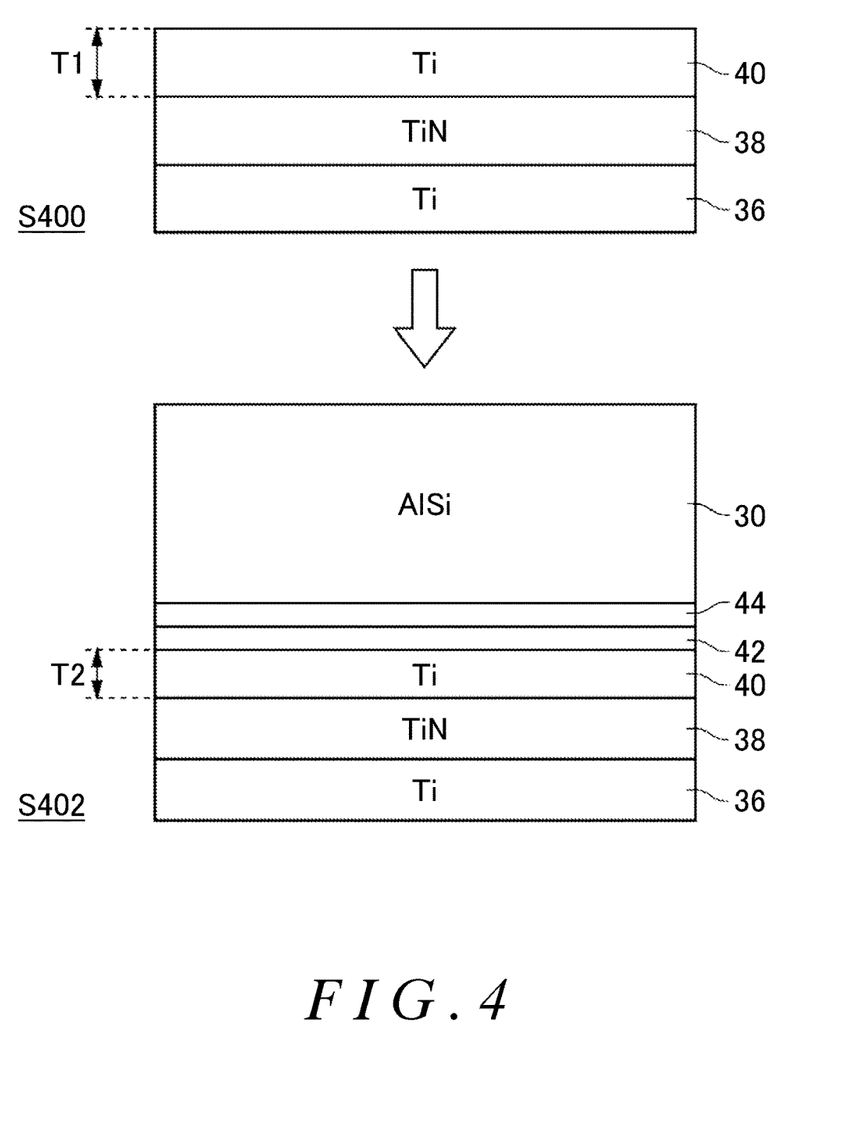
FIG. 4 is a cross-sectional view of an exemplary step for forming each metal layer from the upper hydrogen-absorbing layer 40 to the source electrode 30 in a semiconductor substrate 100 manufacturing method.

FIG. 4 is a cross-sectional view of an exemplary step for forming each metal layer from the upper hydrogen-absorbing layer 40 to the source electrode 30 in a semiconductor substrate 100 manufacturing method. In FIG. 4, each metal layer is shown schematically as a flat layer.

In the semiconductor substrate 100, the lower hydrogen-absorbing layer 36 made of titanium, the nitride layer 38 made of titanium nitride, the upper hydrogen-absorbing layer 40 made of titanium, and the source electrode 30 made of an AlSi alloy may be continuously deposited through sputtering without being exposed to the outside atmosphere. For example, these components were deposited continuously with a deposition chamber pressure of 0.3 Pa, using a magnetron sputtering apparatus.

First, in a first layer formation stage S400, the upper hydrogen-absorbing layer 40 is formed above the semiconductor substrate 10. In the present example, the upper hydrogen-absorbing layer 40 is formed on the nitride layer 38. As an example, the film thickness of the lower hydrogen-absorbing layer 36 is approximately 75 nm and the film thickness of the nitride layer 38 is approximately 75 nm. The initial film thickness T1 of the upper hydrogen-absorbing layer 40 is approximately 75 nm, for example. As an example, the upper hydrogen-absorbing layer 40 is deposited while controlling the temperature of the semiconductor substrate 10 within a range from 150° C. to 250° C. using lamp heating, in an argon atmosphere inside the deposition chamber.

Next, in a second layer formation stage S402, the source electrode 30 is deposited on the upper hydrogen-absorbing layer 40. The initial film thickness of the source electrode 30 is approximately 5 μm, for example. As an example, the source electrode 30 is deposited while controlling the temperature of the semiconductor substrate 10 within a range from 190° C. to 400° C. using lamp heating, in an argon atmosphere inside the deposition chamber. Furthermore, a protective film such as polyimide is formed above the source electrode 30. After the formation of the protective film, annealing is performed at a temperature of approximately 380° C.

In the annealing performed during the formation of the source electrode 30 or after the formation of the protective film, the silicon included in the source electrode 30 is segregated and the Si-containing layer 42 is formed between the upper hydrogen-absorbing layer 40 and the source electrode 30. Titanium, which is a portion of the upper hydrogen-absorbing layer 40, and aluminum, which is a portion of the source electrode 30, form an alloy together, thereby forming the alloy layer 44.

It should be noted that the formation of the alloy layer 44 is restricted at positions farther downward than the peak 43 of the Si-containing layer 42. In this way, even when the source electrode 30 is formed above the upper hydrogen-absorbing layer 40, at least a portion of the upper hydrogen-absorbing layer 40 does not form an alloy and maintains its hydrogen-absorbing function. In the present example, the thickness T2 of the remaining upper hydrogen-absorbing layer 40 was approximately 45 nm.

Furthermore, it is possible to restrict the formation of an alloy between the aluminum or the like included in the source electrode 30 and the titanium or the like included in the upper hydrogen-absorbing layer 40 by using the Si-containing layer 42, and therefore it is possible for a portion of the upper hydrogen-absorbing layer 40 to remain even when the source electrode 30 is formed at a high temperature. Therefore, the source electrode 30 can be formed at a high rate and the coverage of the source electrode 30 can be improved.

The chamber pressure in the second layer formation stage S402 may be greater than or equal to 0.1 Pa and less than or equal to 0.5 Pa. Furthermore, the substrate temperature in the second layer formation stage S402 may be controlled to be a target value greater than or equal to 250° C., or greater than or equal to 270° C. Under such conditions, the Si-containing layer 42 can be formed efficiently.

The thickness of the Si-containing layer 42 may be greater than or equal to 10 nm and less than or equal to 150 nm. The thickness of the Si-containing layer 42 may be greater than or equal to 50 nm and less than or equal to 100 nm. If the Si-containing layer 42 is too thin, the effect of restricting alloy formation becomes small. Furthermore, if the Si-containing layer 42 is too thick, the resistance value between the source electrode 30 and the source region 20 or the like becomes undesirably large. The thickness of the Si-containing layer 42 can be adjusted using the concentration of the silicon contained in the source electrode 30, the deposition temperature of the source electrode 30, the pressure inside the deposition chamber, and the like.

The thickness T2 of the remaining upper hydrogen-absorbing layer 40 is preferably greater than or equal to 10 nm and less than or equal to 1.0 μm. If the upper hydrogen-absorbing layer 40 is too thin, the hydrogen-absorbing effect becomes small. Furthermore, since the hydrogen-absorbing metal such as titanium is a relatively hard material, if the upper hydrogen-absorbing layer 40 is too thick, the upper hydrogen-absorbing layer 40 becomes easily breakable. The thickness T2 of the upper hydrogen-absorbing layer 40 may be less than or equal to 100 nm. The thickness T2 of the remaining upper hydrogen-absorbing layer 40 can be adjusted using the initial thickness T1, the deposition temperature of the source electrode 30, the annealing temperature after formation of the source electrode 30, and the like. The thickness of the alloy layer 44 may be greater than or equal to 10 nm and less than or equal to 50 nm.

Figure 5:
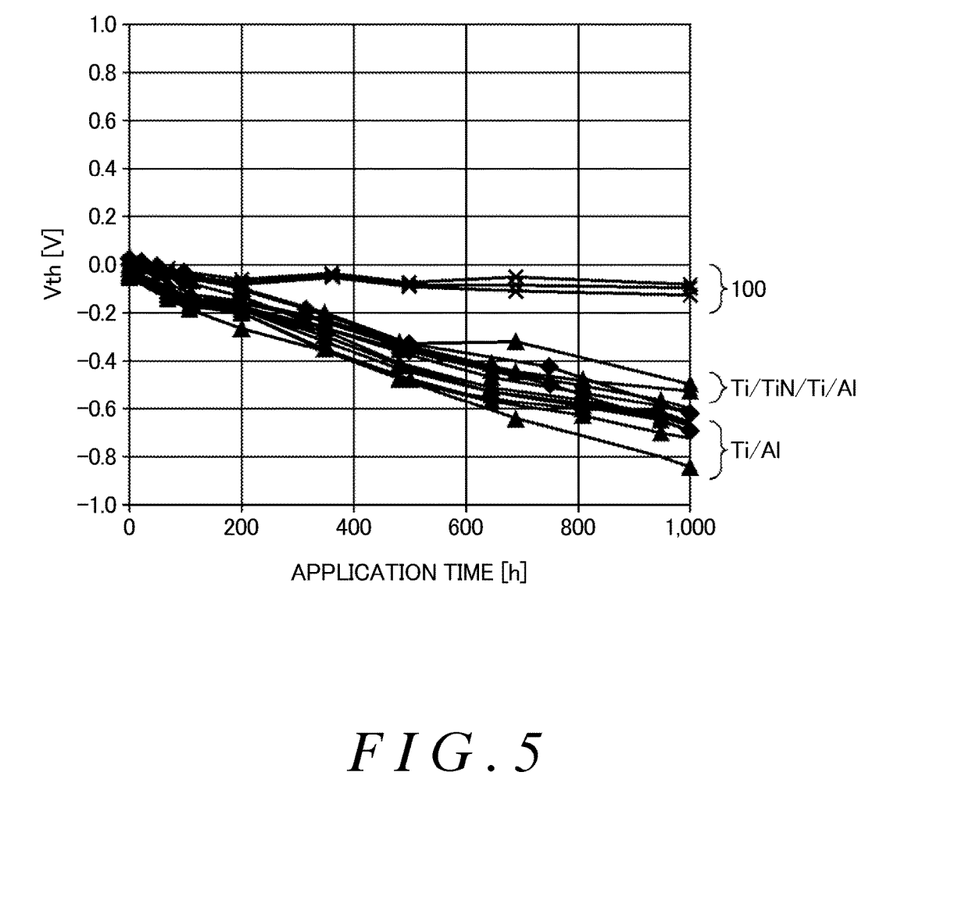
FIG. 5 shows results obtained by measuring the threshold value fluctuation of the semiconductor substrate 100.

FIG. 5 shows results obtained by measuring the threshold value fluctuation of the semiconductor substrate 100. In the present example, the fluctuation of the threshold voltage Vth relative to the application time was measured when a gate voltage of −30 V was applied in an environment where the surrounding temperature was 200° C.

FIG. 5 also shows the measurement results for semiconductor devices that do not include an Si-containing layer 42, serving as comparative examples. One comparative example includes a metal film formed by layering Ti/TiN/Ti/Al, and another comparative example includes a metal film formed by layering UAL The deposition conditions for the Ti and Al in these comparative examples are equivalent to the deposition conditions of the upper hydrogen-absorbing layer 40 and the source electrode 30. In the comparative example, all of the Ti formed under the Al formed an alloy with the Al.

As shown in FIG. 5, the threshold voltage of the semiconductor substrate 100 barely fluctuates even after 1000 hours have passed. In contrast, the threshold voltages of the apparatuses according to the comparative examples decrease as the application time increases. By providing the Si-containing layer 42, it was confirmed that the semiconductor substrate 100 is able to maintain the hydrogen-absorbing effect and to restrict the fluctuation of the threshold voltage.

In the semiconductor substrate 100 used in the measurements of FIG. 5, the (000-1) plane (C plane) was used as the main plain of the semiconductor substrate 10, but the same results are exhibited for a semiconductor substrate 100 using the semiconductor substrate 10 with the (0001) plane (Si plane) as the main plane.

Figure 6:
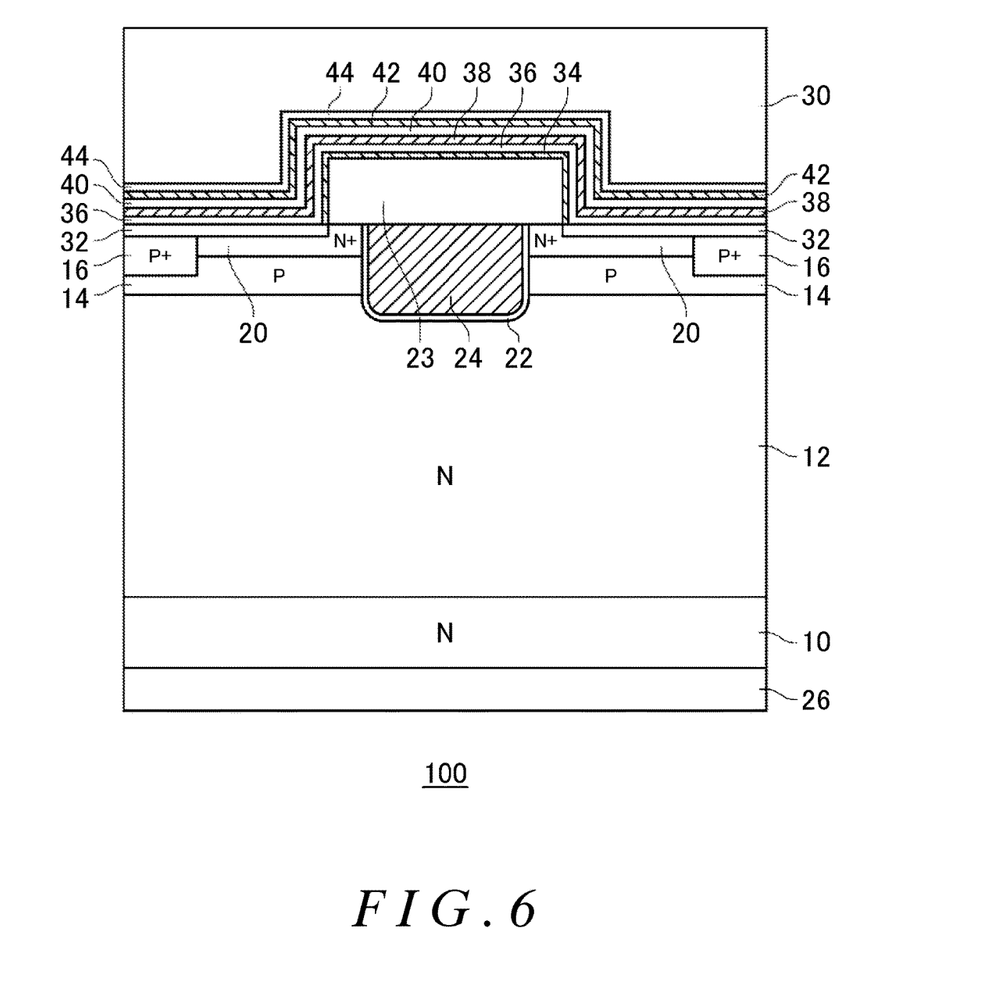
FIG. 6 is a cross-sectional view of another exemplary structure of the semiconductor substrate 100.

FIG. 6 is a cross-sectional view of another exemplary structure of the semiconductor substrate 100. The semiconductor substrate 100 shown in FIG. 1 includes a planar gate structure, but the semiconductor substrate 100 in the present example includes a trench gate structure.

The gate insulating film 22 in the present example is formed covering the side walls of the trench formed in the top surface of the semiconductor layer. Furthermore, the top surface of the trench is covered by the insulating film 23. The gate electrode 24 is covered by the gate insulating film 22 within the trench. This trench is formed penetrating through the source region 20 and the base region 14. The gate electrode 24 is formed at least in a range opposite the base region 14. By applying a prescribed ON voltage to the gate electrode 24, a channel is formed in the base region 14 opposite the gate electrode 24.

The semiconductor substrate 100 in the present example also has a layered structure of metal films in the same manner as the semiconductor substrate 100 shown in FIG. 1. In other words, the Si-containing layer 42 is provided between the upper hydrogen-absorbing layer 40 and the source electrode 30. With the semiconductor substrate 100 of the present example as well, it is possible to restrict the fluctuation of the threshold value.

Furthermore, the semiconductor substrate 100 may be an IGBT (Insulated Gate Bipolar Transistor). In this case, a (P+)-type collector region is formed on the bottom surface side of the semiconductor substrate 10.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

In this Specification, terms such as "up," "down," "above," and "below" are not limited to up-down orientation in the direction of gravity. These terms refer to relative direction on an arbitrary axis.

LIST OF REFERENCE NUMERALS

10: semiconductor substrate, 12: drift layer, 14: base region, 16: contact region, 18: top surface region, 20: source region, 22: gate insulating film, 23: insulating film, 24: gate electrode, 26: drain electrode, 30: source electrode, 32: silicide layer, 34: barrier layer, 36: lower hydrogen-absorbing layer, 38: nitride layer, 40: upper hydrogen-absorbing layer, 42: Si-containing layer, 43: peak, 44: alloy layer, 100: semiconductor device

What is claimed is:

1. A semiconductor device comprising:
a semiconductor substrate;
a gate electrode that is formed above the semiconductor substrate;
an insulating film that covers the gate electrode;
a first layer that is formed above the insulating film, such that the first layer is insulated from the gate electrode, and contains a hydrogen-absorbing first metal;
a second layer that is formed above the first layer and contains a second metal differing from the first metal; and
an Si-containing layer that is formed between the first layer and the second layer, entirely covers the first layer, and contains silicon.

2. The semiconductor device according to claim 1, wherein
the second layer further includes silicon, and
the Si-containing layer has a higher silicon concentration than the second layer.

3. The semiconductor device according to claim 1, wherein
the second metal is aluminum.

4. The semiconductor device according to claim 1, wherein
the first metal is titanium.

5. The semiconductor device according to claim 1, further comprising:
an alloy layer that is formed between the first layer and the second layer and includes the first metal and the second metal.

6. The semiconductor device according to claim 5, wherein
the Si-containing layer is arranged between the first layer and the alloy layer.

7. A semiconductor device comprising:
a semiconductor substrate;
a first layer that is formed above the semiconductor substrate and contains a hydrogen-absorbing first metal;
a second layer that is formed above the first layer and contains a second metal differing from the first metal; and
an Si-containing layer that is formed between the first layer and the second layer and contains silicon, wherein
a silicon concentration distribution of the semiconductor device includes a peak in a depth direction of the Si-containing layer, and the silicon concentration on the second layer side of the peak decreases more gradually than on the first layer side of the peak.

8. The semiconductor device according to claim 7, wherein
a mass ratio of the silicon at a position of the peak is greater than or equal to 10%.

9. The semiconductor device according to claim 1, wherein
the Si-containing layer has a thickness that is greater than or equal to 10 nm and less than or equal to 150 nm.

10. The semiconductor device according to claim 1, wherein
the first layer has a thickness that is greater than or equal to 10 nm and less than or equal to 1.0 μm.

11. A manufacturing method of a semiconductor device, comprising:
gate electrode formation of forming a gate electrode above a semiconductor substrate;
insulating film formation of forming an insulating film that covers the gate electrode;
first layer formation of forming a first layer that contains a hydrogen-absorbing first metal above the insulating film, such that the first layer is insulated from the gate electrode;
second layer formation of forming a second layer containing a second metal differing from the first metal above the first layer; and
Si-containing layer formation of forming an Si-containing layer that contains silicon between the first layer and the second layer to entirely cover the first layer.

12. The manufacturing method according to claim 11, wherein
the second layer formation includes forming the second layer including silicon, and
the Si-containing layer formation includes forming the Si-containing layer by segregating silicon included in the second layer.

* * * * *